(12) United States Patent
Knotz et al.

(10) Patent No.: US 8,009,710 B2
(45) Date of Patent: Aug. 30, 2011

(54) LASER DRIVER CIRCUIT, METHOD FOR CONTROLLING A LASER DRIVER CIRCUIT, AND USE

(75) Inventors: Herbert Knotz, Erbach (DE); Holger Vogelmann, Schwendi (DE); Peter Kolb, Illertissen (DE); Michael Offenwanger, Burgau (DE); Stefan Schabel, Syrgenstein (DE)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/538,305

(22) Filed: Aug. 10, 2009

(65) Prior Publication Data

US 2010/0034226 A1    Feb. 11, 2010

Related U.S. Application Data

(60) Provisional application No. 61/088,919, filed on Aug. 14, 2008.

(30) Foreign Application Priority Data

Aug. 8, 2008    (DE) .......................... 10 2008 036 985

(51) Int. Cl.
*H01S 3/00*    (2006.01)
(52) U.S. Cl. ................. 372/38.02; 372/38.07; 372/38.01
(58) Field of Classification Search ............... 372/38.02, 372/38.07, 38.01
See application file for complete search history.

(56) References Cited

U.S. PATENT DOCUMENTS

| 6,400,673 | B1 | 6/2002 | Shigemori |
| 7,075,882 | B2 * | 7/2006 | Gyo ............................. 369/116 |
| 2002/0114364 | A1 | 8/2002 | Seo et al. |
| 2003/0048821 | A1 | 3/2003 | Iimura et al. |
| 2005/0047316 | A1 | 3/2005 | Yamamoto |
| 2007/0036056 | A1 | 2/2007 | Seo |
| 2007/0096963 | A1 * | 5/2007 | De Boer et al. ............... 341/144 |
| 2007/0147450 | A1 | 6/2007 | Inoue et al. |
| 2007/0280316 | A1 | 12/2007 | Kitamura |
| 2008/0008066 | A1 * | 1/2008 | Rees et al. ................. 369/47.15 |

* cited by examiner

*Primary Examiner* — Kinam Park
(74) *Attorney, Agent, or Firm* — Baker Botts L.L.P.

(57) ABSTRACT

A laser driver circuit comprising an amplifier device with a plurality of switchable subamplifiers, which can be or are connected to an output for connection of a laser, ith an analog switching device for switching of analog input signals, a plurality of analog inputs for the analog input signals, a plurality of control inputs for receiving digital control signals, wherein each switchable subamplifier has a switching device for switching the amplification by one of the digital control signals, a digital switching device connected to an input of each switching device for the selectable connection of the input of the switching device of each switchable subamplifier to a control input. Whereby each switchable subamplifier has an analog input, which is connected to the analog switching device for the selectable switching of an analog input signal to the analog input.

8 Claims, 2 Drawing Sheets

LASER DRIVER CIRCUIT, METHOD FOR CONTROLLING A LASER DRIVER CIRCUIT, AND USE

This nonprovisional application claims priority to German Patent Application No. 10 2008 036 985.3, which was filed in Germany on Aug. 8, 2008, and to U.S. Provisional Application No. 61/088,919, which was filed on Aug. 14, 2008, and which are both herein incorporated by reference.

BACKGROUND OF THE INVENTION

1. Field of the Invention

The present invention relates to a laser driver circuit, to a method for controlling a laser driver circuit, and to a use thereof.

2. Description of the Background Art

For drives in which compact discs are provided as storage media, laser semiconductor diodes are used to read information from the storage media or to write said information. Laser diodes are needed in different wavelength ranges depending on the employed storage medium technology. Defined light pulses emitted by the laser diode are needed to read or write information on a storage medium. The pulses in this case must be matched to the employed laser diode and the employed storage medium. A matching of this type can be described as a write strategy in the case of a writing process.

To be able to drive an output current for the laser diode, multiple individual currents are summed to form a current pulse before amplification, so that a single amplifier provides the output current. The area of the output amplifier on the semiconductor chip is determined by the level of the maximum output current. The individual currents can also be amplified separately and after the amplification summed in each case by an amplifier. The area of each amplifier is thereby to be designed for the maximum output current of the same. In bipolar technology, a mutual output amplifier can be easily realized, whereas in CMOS technology output amplifiers for the required high speed are realized with an essentially different circuit technology than in bipolar technology.

SUMMARY OF THE INVENTION

It is therefore an object of the present invention to provide a driver circuit for a laser diode. Accordingly, a laser driver circuit is provided which is formed to drive the output current pulses for a semiconductor laser diode. The current pulses preferably defined in their shape are provided here by the laser driver circuit, whereby the defined shape—therefore the course and amplitude and length of the current pulse—is advantageously settable as variable. Preferably, the laser driver circuit is integrated monolithically on a semiconductor chip.

The laser driver circuit can have a plurality of control inputs for receiving digital control signals. The control inputs thereby form a digital parallel interface for the parallel receiving of the digital control signals. The digital control signals function to define the current pulse shape; the digital control signals of the different control inputs may have a pulse length different from one another and/or can be offset in time to one another. The parameters of the digital control signals may be set, for example, by a signal generating circuit connectable to the laser driver circuit.

The laser driver circuit can have an amplifier device with a plurality of switchable subamplifiers, which can be or are connected to an output for connection of a laser. Preferably, the amplifier device is formed to switch and to amplify one or more analog input signals. The analog outputs of the switchable subamplifiers are preferably connected to one another. The output currents of the subamplifiers are preferably summed in one or more current summing nodes. The output is advantageously formed as a pin for connection of a semiconductor laser diode. The switchable subamplifiers can be formed as switchable current amplifiers or switchable transconductance amplifiers particularly using CMOS technology.

The laser driver circuit can have an analog switching device. The analog switching device can be formed for switching analog input signals with a plurality of analog inputs for the analog input signals. The constant currents or voltages can be applied at the analog inputs, which are unchangeable within a pulse. The constant currents or voltages can be changed before the pulses are applied. For switching, the analog switching device has a switching component, such as, for example, analog multiplexers.

Each switchable subamplifier can have a switching device for switching the amplifier. The switching device can be, for example, a current mirror switchable by means of a transistor. The amplification can be switched on and off. Each switchable subamplifier can be formed for switching by one of the digital control signals.

The laser driver circuit can have a digital switching device connectable to an input of each switching device. The digital switching device can be formed for the selectable connection of the input of the switching device to a control input. Preferably, the digital switching device is formed to select precisely one of the control inputs for connection or to select no control input. Therefore, when a control input is selected, the associated digital input signal acts on the switching processes in the associated subamplifier of the amplifier device. If no control input is selected, the associated subamplifier is deactivated.

Each switchable subamplifier has an analog input, which is connected to the analog switching device for switching an analog input signal to the analog input. Preferably, the analog input of each subamplifier is connected directly to the analog switching device. It is possible alternatively for switching the analog input signal to the analog input of the subamplifier to amplify the analog input signal in addition by an interconnected amplifier.

The object of the invention is furthermore to provide as improved a method as possible for controlling a laser driver circuit. Accordingly, a method for controlling a laser driver circuit is provided. The laser driver circuit has analog inputs and digital control inputs and an amplifier device with a plurality of switchable subamplifiers.

In the method, each switchable subamplifier can be assigned to no or precisely one digital control input by means of control of a multiplexer.

Each switchable subamplifier can be assigned to no or precisely one analog input by means of control of an analog multiplexer.

Furthermore a use is provided. Therefore, use of a plurality of individually switchable subamplifiers of an amplifier device to provide an output current for a laser by current summing of the output currents of the switchable subamplifiers is provided.

To provide the output current, multiple switchable subamplifiers are connected to precisely one digital control input by means of multiplexers and to precisely one analog input by means of analog multiplexers. Preferably, the multiplexers and the analog multiplexers are controlled in an interdependent manner.

The refinements described hereinafter relate to the laser driver circuit, as well as to the use and to the method for controlling a laser driver circuit.

According to an embodiment, the digital switching device can have a plurality of multiplexers. The particular multiplexer can be connected to the input of the associated switching device. The multiplexers are connected to the control inputs preferably directly or indirectly via a logic, for example, for release. As an alternative to multiplexers, the digital switching device may have a transistor logic or gate logic, which is connected to each input of the switching devices of the subamplifier.

According to an embodiment, the analog switching device can have a plurality of analog multiplexers. Preferably, each analog multiplexer is connected to precisely one analog input of an assigned switchable subamplifier.

In an embodiment, the laser driver circuit has a control circuit, which is formed to set the multiplexers of the subamplifiers of the amplifier device. Preferably, the control circuit is connected to a digital input of the amplifier device for setting. Another, also combinable advantageous refinement provides that the control circuit is formed for setting the analog multiplexers. Preferably, the control circuit is connected to a digital input of the analog switching device for the setting.

The control circuit can have, for example, a logic for setting. The control circuit can have a plurality of registers, each register being assigned to a multiplexer of a subamplifier and/or to an analog multiplexer of the analog switching device. If the multiplexer has, for example, four switching positions, the associated register has at least a two-bit width for setting all four switching positions.

According to an embodiment, analog outputs of all subamplifiers for current summing can be connected to the output for connection of the laser. For current summing, in this case, one or more current summing nodes can be provided, which merge the current of the subamplifiers.

It is provided preferably that the assignment of each switchable subamplifier to no or precisely one digital control input can be stored by means of a register value in a memory of the laser driver circuit. Preferably, the assignment of each switchable subamplifier to no or precisely one analog input is stored by means of a register value. Advantageously, the assignments to the digital control input and to the analog input are interconnected logically.

Further, the subamplifiers can be formed to be the same.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
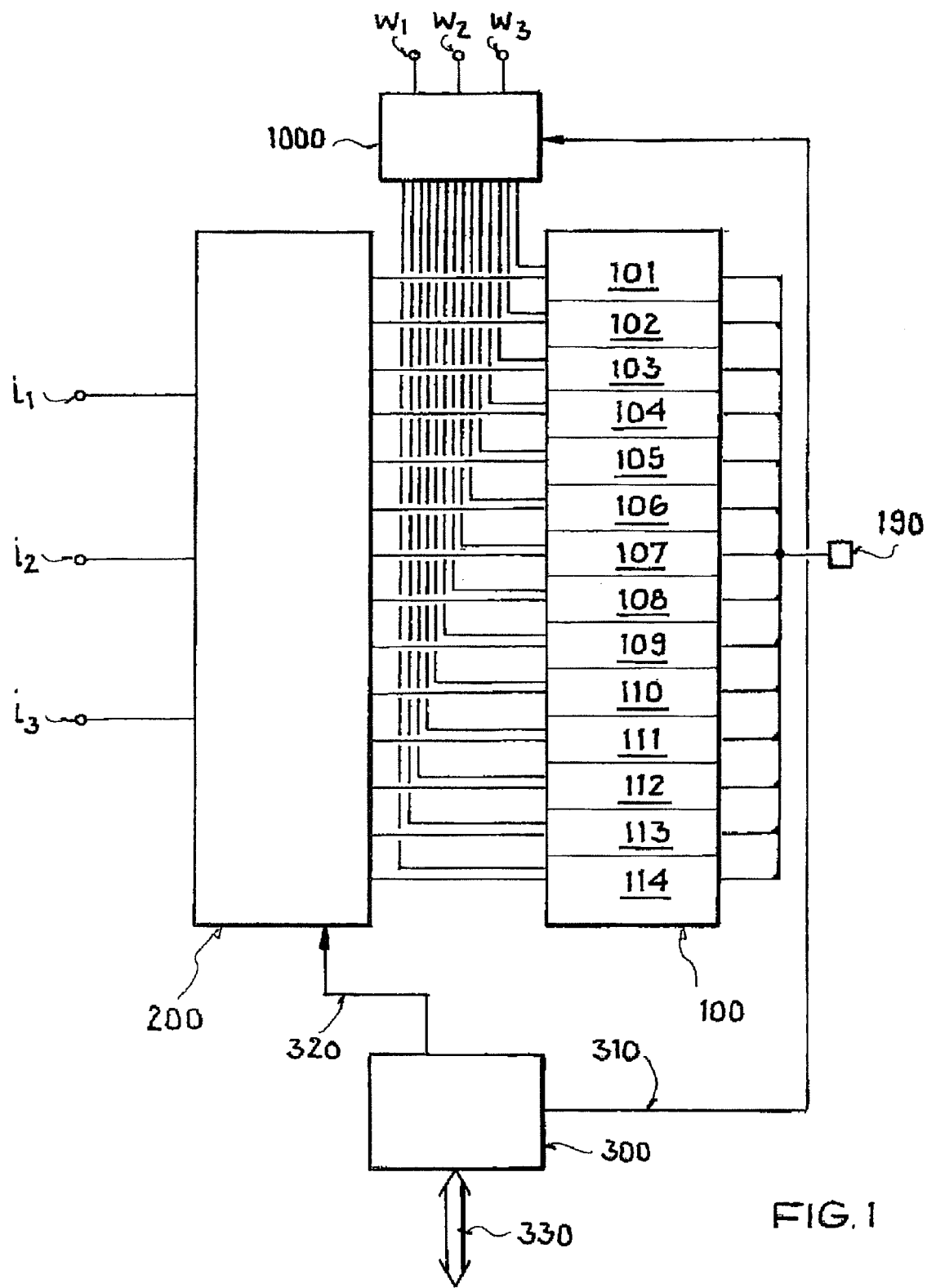
FIG. 1 shows a schematic illustration of a laser driver circuit of a first exemplary embodiment.

A laser driver circuit is shown schematically in FIG. 1 by a block diagram. The laser driver circuit has an amplifier device 100, an analog switching device 200, a digital switching device 1000, and a control circuit 300. Analog switching device 200 is connected to a plurality of analog inputs i1, i2, and i3. In the exemplary embodiment of FIG. 1, analog inputs i1, i2, and i3 are formed as current inputs. Analog switching device 200 has a plurality of (14) analog outputs, which are connected to analog inputs of amplifier device 100. Analog switching device 200 is formed to switch each of its analog outputs to no or precisely one of analog inputs i1, i2, or i3.

Each analog input of amplifier device 100 is assigned a switchable subamplifier 101 to 114. Each analog output of each subamplifier 101 to 114 is connected to terminal 190 to connect a semiconductor laser diode (not shown in FIG. 1). For switching switchable subamplifiers 101 to 114, amplifier device 100 is connected via digital switching device 1000 to control inputs w1, w2, w3 to switch via dynamic digital control signals of the individual subamplifiers 101 to 114. For this purpose, digital switching device 1000 has a multiplex function, as a result of which each switchable subamplifier 101 to 114 can be connected to no or precisely one control input w1 or w2 or w3. Therefore, a switchable subamplifier 101 to 114 cannot be connected simultaneously to two control inputs, so that at the same time only the selection of a single control input or no control input is possible.

The two multiplex functions of analog switching device 200 and digital switching device 1000 are controllable by control circuit 300. To this end, control circuit 300 is connected via a first connection 310 to an input of digital switching device 1000 and via a second connection 320 to analog switching device 200. Preferably, control circuit 300 has registers whose register values establish the switching positions of multiplexers of digital switching device 1000 and analog switching device 200.

Preferably, the switching positions of digital switching device 1000 and analog switching device 200 are assigned to one another. For example, first subamplifier 101 is connected to first control input w1 for switching by means of the control signal of the first control input. At the same time, analog switching device 200 is switched in such a way that the analog input of first subamplifier 101 is connected via analog switching device 200 to first analog input i1. If the assignment of analog input i1, i2, i3 to control inputs w1 or w2 or w3 is fixed, the same signal is transmitted over both connections 310 and 320, so that both connections 310 and 320 can also be interconnected.

Furthermore, control circuit 300 has a serial or parallel interface 330, for example, a bus interface, over which the register values can be written in or read out of the register. Interface 330 can form, for example, a connection to a microcontroller (not shown), which together with the laser driver circuit can be integrated monolithically on a semiconductor chip. Analog inputs i1, i2, i3 can be connected to amplifiers, digital-to-analog converters, and/or current sources, which advantageously are integrated monolithically together with the laser driver circuit on a semiconductor chip. Control inputs w1, w2, w3 are connected advantageously to a signal generating circuit and/or a digital logic, which are advantageously integrated monolithically together with the laser driver circuit on a semiconductor chip. Alternatively, connection of circuits to laser driver circuit pins connected to control inputs w1, w2, w3 and analog inputs i1, i2, i3 is possible.

Figure 2:
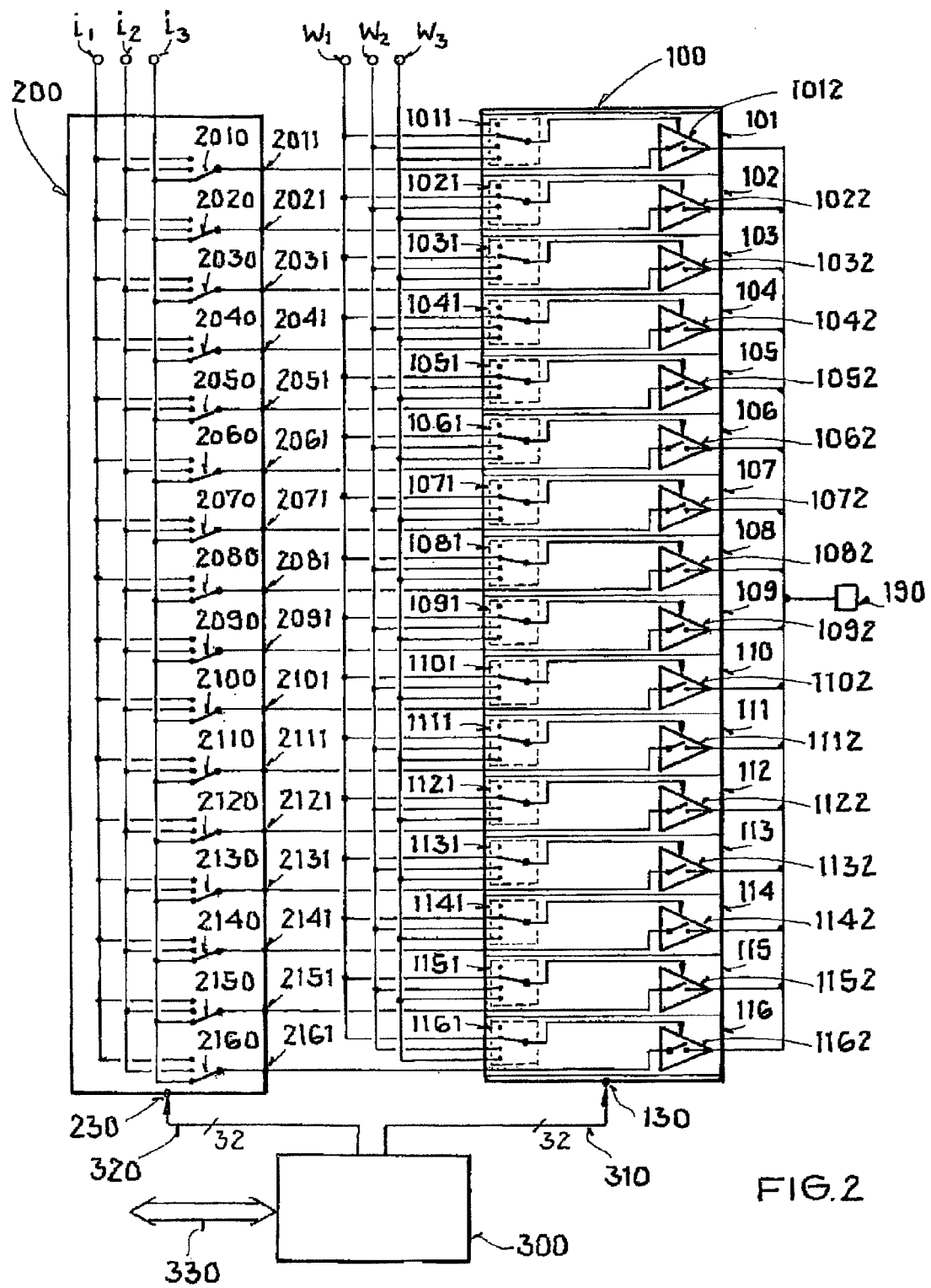
FIG. 2 shows a schematic illustration of a laser driver circuit of a second exemplary embodiment.

Another exemplary embodiment of a laser driver circuit is shown schematically in FIG. 2. Amplifier device 100 in this exemplary embodiment has 16 switchable subamplifiers 101 to 116. Subamplifiers 101 to 116 are all connected via a current summing node to an output 190 for connection of a semiconductor laser (not shown). Each switchable subamplifier 101 to 116 has a switching device 1012 to 1162, for example, in the form of a switchable transconductance amplifier or a switchable current mirror for current amplification. The analog input of switching device 1012 to 1162 of each subamplifier 101 to 116 is connected to an analog switching device 200.

In the exemplary embodiment of FIG. 2, a digital switching device is formed by multiple multiplexers 1011 to 1161, each multiplexer 1011 to 1161 being integrated into a subamplifier 101 to 116. Each multiplexer 1011 to 1161 is connected to an input of the associated switching device 1012 to 1162 and to each control input w1, w2, and w3 of the laser driver circuit. By means of control via a 2-bit line, the switching position of the specific multiplexer 1011 to 1161 can be switched between precisely one of the three control inputs w1 or w2 or w3 or a switching position without a connection to the control inputs. To this end, the two control bits are stored statically in a register in control circuit 300. Therefore, for 16 multiplexers 1011 to 1161 of the 16 subamplifiers 101 to 116 a 32-bit-wide control connection is necessary to control independently all multiplexers 1011 to 1161.

By means of the programming of the register values of the register in control circuit 300, it is possible to assign a maximum output current or a scaling factor to each dynamic control signal at one of control inputs w1, w2, or w3 by means of the number of connected subamplifiers 101, . . . , 116. With activation of subamplifiers thereby not only the maximum output current changes, but also an amplification factor, which can be designated as scaling. The effect is that the particular maximum output current can always be achieved (reproducible) at the same input current.

Compared with conventional laser drivers, several advantages are achieved by the exemplary embodiment of FIG. 2. In sum, a rather small chip area is needed for the amplification function. Dynamic properties are improved. Moreover, a higher resolution can be achieved at small output currents by the scaling function.

Accordingly, analog multiplexers 2010 to 2160 are controlled statically via connection 320 and input 230, so that accordingly analog inputs i1, i2, i3 for analog signals, such as, for example, static currents, are connected via the specific analog multiplexer 2010 to 2160 to an analog output 2011 to 2161 of analog switching device 200. Therefore, each switchable subamplifier 101, . . . , 116 has an analog input, which is connected to analog switching device 200 for switching an analog input signal i1, i2, i3 to the analog input of switchable subamplifier 101, . . . , 116.

For example, it is possible to assign to the control input w1 the first eight subamplifiers 101 to 108, so that the control signal at first control input w1 switches the eight subamplifiers 101 to 108. The second control input w2 is assigned accordingly six additional subamplifiers 109 to 114. The third control input w3 is assigned the 15$^{th}$ subamplifier 115. The 16$^{th}$ subamplifier 116, in contrast, is assigned to no control input. With this programming, the lowest output current is possible through the third control signal w3 therefore through subamplifier 115 alone and the highest output current through the mutual simultaneous control signals w1 and w2 and w3 therefore through subamplifiers 101 to 115.

This results in the surprising effect that oversizing of amplifier device 100 is not necessary. Amplifier device 100 must only be designed for the maximum necessary current, irrespective of how large the partial contributions by the individual control signals w1, w2, w3 to be effected. The partial contributions can be adjusted individually for each laser diode type by flexible assigning of switchable subamplifiers 101 to 116.

The invention is not limited to the shown embodiment variants in FIG. 1 or 2. For example, it is possible to provide a greater or smaller number of subamplifiers. It is also possible to connect additional analog stages upstream of analog inputs i1, i2, i3. It is also possible to connect a digital logic upstream of the control inputs. It is likewise possible to provide a plurality of amplifier devices for multiple laser diodes or a switching of the amplifier device to multiple outputs.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A laser driver circuit comprising:
an amplifier device having a plurality of switchable subamplifiers that are connectable to an output for connecting a laser, said amplifier device further including:
a plurality of switching devices each associated with a respective one of said plurality of switchable subamplifiers for switching the amplification by one of a plurality of digital control signals;
a plurality of control inputs for receiving respective ones of said digital control signals; and
a digital switching device including a plurality of multiplexers, each multiplexer for connection to an input of each of said switching devices for selectably connecting an input of the switching device of each switchable subamplifier to respective one of said plurality of control inputs,
said laser device further comprising:
an analog switching device for switching analog input signals; and
a plurality of analog inputs for the analog input signals;
wherein each of said plurality of switchable subamplifiers has an analog input, which is connectable to the analog switching device for selectably switching an analog input signal to the analog input.

2. The laser driver circuit according to claim 1, wherein the analog switching device has a plurality of analog multiplexers, each analog multiplexer being connectable to an analog input of an assigned switchable subamplifier.

3. The laser driver circuit according to claim 1, further comprising a control circuit which for setting the multiplexers of the subamplifiers of the amplifier device is connectable to an input of the amplifier device.

4. The laser driver circuit according to claim 3, wherein the control circuit has a plurality of registers, each register being assigned to the multiplexer of a subamplifier.

5. The laser driver circuit according to claim 1, wherein analog outputs of all subamplifiers for current summing are connectable to the output for connection of the laser.

6. A method for controlling a laser driver circuit with analog inputs and digital control inputs and with an amplifier device with a plurality of switchable subamplifiers, the method comprising:

assigning each switchable subamplifier to none or precisely one digital control input via control of a multiplexer; and assigning each switchable subamplifier to none or precisely one analog control input via control of an analog multiplexer, wherein the assignment of each switchable subamplifier to none or precisely one digital control input is stored via a register value, and wherein the assignment of each switchable subamplifier to none or precisely one analog control input is stored via a register value.

7. The laser driver circuit according to claim 2, further comprising a control circuit which for setting the analog multiplexers is connectable to an input of the analog switching device.

8. A laser driver circuit comprising:
  an amplifier device having a plurality of switchable subamplifiers that are connectable to an output for connecting a laser;
  an analog switching device for switching analog input signals;
  a plurality of analog inputs for the analog input signals;
  a plurality of control inputs for receiving digital control signals;
  a switching device of each switchable subamplifier for switching the amplification by one of the digital control signals; and
  a digital switching device connectable to an input of each switching device of each switchable subamplifier for selectably connecting an input of the switching device of each switchable subamplifier to a control input,
  wherein each switchable subamplifier has an analog input, each analog input being connectable to a different associated output of the analog switching device for selectably switching an analog input signal to the analog input.

* * * * *

UNITED STATES PATENT AND TRADEMARK OFFICE
CERTIFICATE OF CORRECTION

| | |
|---|---|
| PATENT NO. | : 8,009,710 B2 |
| APPLICATION NO. | : 12/538305 |
| DATED | : August 30, 2011 |
| INVENTOR(S) | : Herbert Knotz et al. |

It is certified that error appears in the above-identified patent and that said Letters Patent is hereby corrected as shown below:

Title page, Abstract, Line 3, after "for connection of a laser," delete "ith" and insert -- with --.

Signed and Sealed this
Twelfth Day of November, 2013

Teresa Stanek Rea
*Deputy Director of the United States Patent and Trademark Office*